US011831282B2

(12) United States Patent
Minami

(10) Patent No.: US 11,831,282 B2
(45) Date of Patent: *Nov. 28, 2023

(54) HIGH FREQUENCY PACKAGE

(71) Applicant: SUMITOMO ELECTRIC DEVICE INNOVATIONS, INC., Kanagawa (JP)

(72) Inventor: Tadashi Minami, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/846,561

(22) Filed: Jun. 22, 2022

(65) Prior Publication Data

US 2022/0329213 A1 Oct. 13, 2022

Related U.S. Application Data

(63) Continuation of application No. 16/553,538, filed on Aug. 28, 2019, now Pat. No. 11,398,800.

(30) Foreign Application Priority Data

Aug. 29, 2018 (JP) .................................. 2018-160229

(51) Int. Cl.
*H03F 1/32* (2006.01)
*H03F 3/193* (2006.01)
(Continued)

(52) U.S. Cl.
CPC ........... *H03F 1/3205* (2013.01); *H01L 23/66* (2013.01); *H03F 3/193* (2013.01); *H03H 7/06* (2013.01);
(Continued)

(58) Field of Classification Search
CPC .. H03F 1/3205; H03F 3/193; H03F 2200/171; H03F 2200/222;
(Continued)

(56) References Cited

U.S. PATENT DOCUMENTS

| 11,398,800 | B2 * | 7/2022 | Minami | .................... | H03H 7/06 |
| 2015/0280697 | A1 * | 10/2015 | Takagi | ................. | H03K 5/1252 |
| | | | | | 327/551 |
| 2019/0165753 | A1 | 5/2019 | Arigong | | |

FOREIGN PATENT DOCUMENTS

| JP | H6-140862 | 5/1994 |
| JP | 2002-252523 | 9/2002 |

(Continued)

*Primary Examiner* — Andrea Lindgren Baltzell
*Assistant Examiner* — Khiem D Nguyen
(74) *Attorney, Agent, or Firm* — SMITH, GAMBRELL & RUSSELL, LLP.

(57) ABSTRACT

A high frequency package includes a package having an input terminal and an output terminal. A substrate housed in the package, has a first side, a second side facing the input terminal, and a third side facing the output terminal. The first side extends in a first direction and connects the second side and the third side, and the second side and the third side extend in a second direction intersecting the first direction. A coupling circuit on the substrate is electrically connected to the input terminal and the output terminal to input an input signal from the input terminal disposed at the second side of the substrate and output an output signal to the output terminal disposed at the third side of the substrate. A filter circuit on the substrate is electrically connected to the coupling circuit, an is configured to reduce third-order IMD (Inter Modulation Distortion) included in the output signal. The output signal is output from the coupling circuit in a middle of the output terminal side of the third side of the substrate. The filter circuit is arranged on an edge of the first side of the substrate, and an edge of the third side of the substrate.

9 Claims, 9 Drawing Sheets

(51) Int. Cl.
    *H01L 23/66*     (2006.01)
    *H03H 7/06*     (2006.01)
    *H01L 23/00*     (2006.01)

(52) U.S. Cl.
    CPC .............. *H01L 24/48* (2013.01); *H01L 24/49* (2013.01); *H01L 2223/6611* (2013.01); *H01L 2223/6655* (2013.01); *H01L 2224/48153* (2013.01); *H01L 2224/49176* (2013.01); *H03F 2200/171* (2013.01); *H03F 2200/222* (2013.01); *H03F 2200/387* (2013.01); *H03F 2200/451* (2013.01)

(58) Field of Classification Search
    CPC ......... H03F 2200/387; H03F 2200/451; H03F 1/56; H03F 1/565; H01L 23/66; H01L 24/48; H01L 24/49; H01L 2223/6611; H01L 2223/6655; H01L 2224/48153; H01L 2224/49176; H01L 2223/6644; H01L 2224/48091; H01L 2224/49111; H01L 2224/49175; H01L 2924/00014; H01L 2924/1902; H01L 2924/19107; H03H 7/06; H03H 7/1791
    USPC .................................................. 330/295, 307
    See application file for complete search history.

(56)             References Cited

FOREIGN PATENT DOCUMENTS

| | | |
|---|---|---|
| JP | 2003-17948 | 1/2003 |
| JP | 2012-208635 | 10/2012 |
| JP | 2016-158217 | 9/2016 |

\* cited by examiner

HIGH FREQUENCY PACKAGE

This application claims the benefit of priority from U.S. application Ser. No. 16/553,538 filed on Aug. 28, 2019, which application claims the benefit of priority from Japanese Application No. JP2018-160229 filed on Aug. 29, 2018, the entire contents of which are incorporated herein by reference.

TECHNICAL FIELD

One aspect of the present invention relates to a high frequency amplifier.

BACKGROUND

Patent Document 1: Japanese Unexamined Patent Publication No. H6-140862 discloses a technique relating to a bias choke circuit used for a high frequency amplifier. The bias choke circuit is realized by an inductor and a capacitor connected between a DC supply node and an RF circuit bias point and connected in parallel to each other.

Patent Document 2: Japanese Unexamined Patent Publication No. 2016-158217 discloses a technique relating to a high frequency semiconductor device. The high frequency semiconductor device includes a plurality of unit FETs, a matching circuit and a plurality of low-frequency oscillation suppression circuits. The plurality of unit FETs are arranged in parallel with each other. The matching circuit is composed by coupling N (note that N is an integer of 2 or larger) stages of branch lines formed by branching one line into a plurality of lines, and includes a line having a plurality of divided end portions connected to the plurality of unit FETs. The plurality of low-frequency oscillation suppression circuits are connected to the plurality of branch lines which compose n-th (note that n is an integer of 2 or larger and N or smaller) stages of the matching circuit. Each of the plurality of low-frequency oscillation suppression circuit is connected to a position on the branch line to which the circuit concerned is connected, where electric lengths to the plurality of unit FETs connected to the branch line concerned are substantially equal to each other.

Patent Document 3: Japanese Unexamined Patent Publication No. 2003-017948 discloses a technique relating to a power amplifier. The power amplifier includes a transistor, an input matching circuit, an output matching circuit, two capacitors, a gate bias supply circuit, a drain bias supply circuit, and an impedance conversion circuit. The transistor functions as an amplifier. The input matching circuit is connected to a gate terminal of the transistor to maximize a gain of the transistor. The output matching circuit is connected to a drain terminal of the transistor to maximize a saturation output of the transistor. The two capacitors are respectively connected between an input terminal of the power amplifier and the input matching circuit and between an output terminal of the power amplifier and the output matching circuit in order to achieve DC blocking. The gate bias supply circuit is connected to a node between the input matching circuit and the gate terminal of the transistor. The gate bias supply circuit is set so that an impedance in a frequency band of an input signal becomes extremely large as viewed from the gate terminal of the transistor to a gate bias supply terminal. The drain bias supply circuit is connected to a node between the output matching circuit and the drain terminal of the transistor. The drain bias supply circuit is set such that an impedance in a frequency band of an output signal becomes extremely large as viewed from the drain terminal to a drain bias supply terminal. The impedance conversion circuit is connected to the drain bias supply circuit and increases a real part of an impedance in a low frequency band corresponding to a frequency difference between two input signals.

In recent wireless communication, various techniques are adopted to increase a transmission rate, and a multicarrier transmission scheme is one of such techniques. In the multicarrier transmission system, a plurality of subcarriers exists in a certain frequency band, and it is important to reduce interference between the subcarriers. Therefore, an amplifier in a transmitter is required to reduce third-order intermodulation distortion (IM3). The IM3 rapidly increases when the frequency difference between the subcarriers exceeds 50 MHz to 60 MHz. In general, as the number of the subcarriers increases (as the order becomes higher), a wider bandwidth is required. Further, with an increase in an operating frequency in recent years, the required bandwidth becomes wide.

In order to reduce the IM3, there is a method of connecting a filter circuit next to a signal output end of the high frequency amplifier. For example, a notch filter (Band Rejection Filter: BRF) can be constituted by connecting a resonant filter constituted by an LC parallel circuit to an output side of a transistor that is an amplifying element, and designing an impedance viewed from the transistor to have a maximum value at a resonant frequency of the resonant filter. By matching the resonant frequency to a carrier frequency, it is possible to reduce the IM3 appearing at the output side.

However, as the filter circuit is arranged farther from the transistor, an effect of reducing the IM3 becomes less. In order to enhance the effect of reducing the IM3, it is desirable to dispose the filter circuit next to the transistor, but with miniaturization of the high frequency amplifier and densification of component arrangement for an improvement in RF characteristics, it is difficult to provide an arrangement space for the filter circuit next to the transistor. Therefore, it is desirable to place the filter circuit for reducing the IM3 next to the amplification element.

SUMMARY

A high frequency amplifier device according to an embodiment including: a high frequency amplifier amplifying a high frequency signal, and outputting to a plurality of signal output ports the high frequency signal amplified; a coupling circuit provided side-by-side with the high frequency amplifier in a first direction on a substrate, and electrically connected to the plurality of signal output ports, the coupling circuit configured to couple output signals output from the plurality of signal output ports and output one output signal to an output terminal; and a filter circuit provided on the substrate and electrically connected to the coupling circuit, the filter circuit configured to reduce third-order IMD (Inter Modulation Distortion) included in the one output signal. The one output signal is output from a middle of the substrate in a second direction intersecting with the first direction, and the filter circuit is arranged next to an edge of the substrate in the second direction, and arranged next to an edge of the substrate on the output terminal side in the first direction.

DETAILED DESCRIPTION

Figure 1:
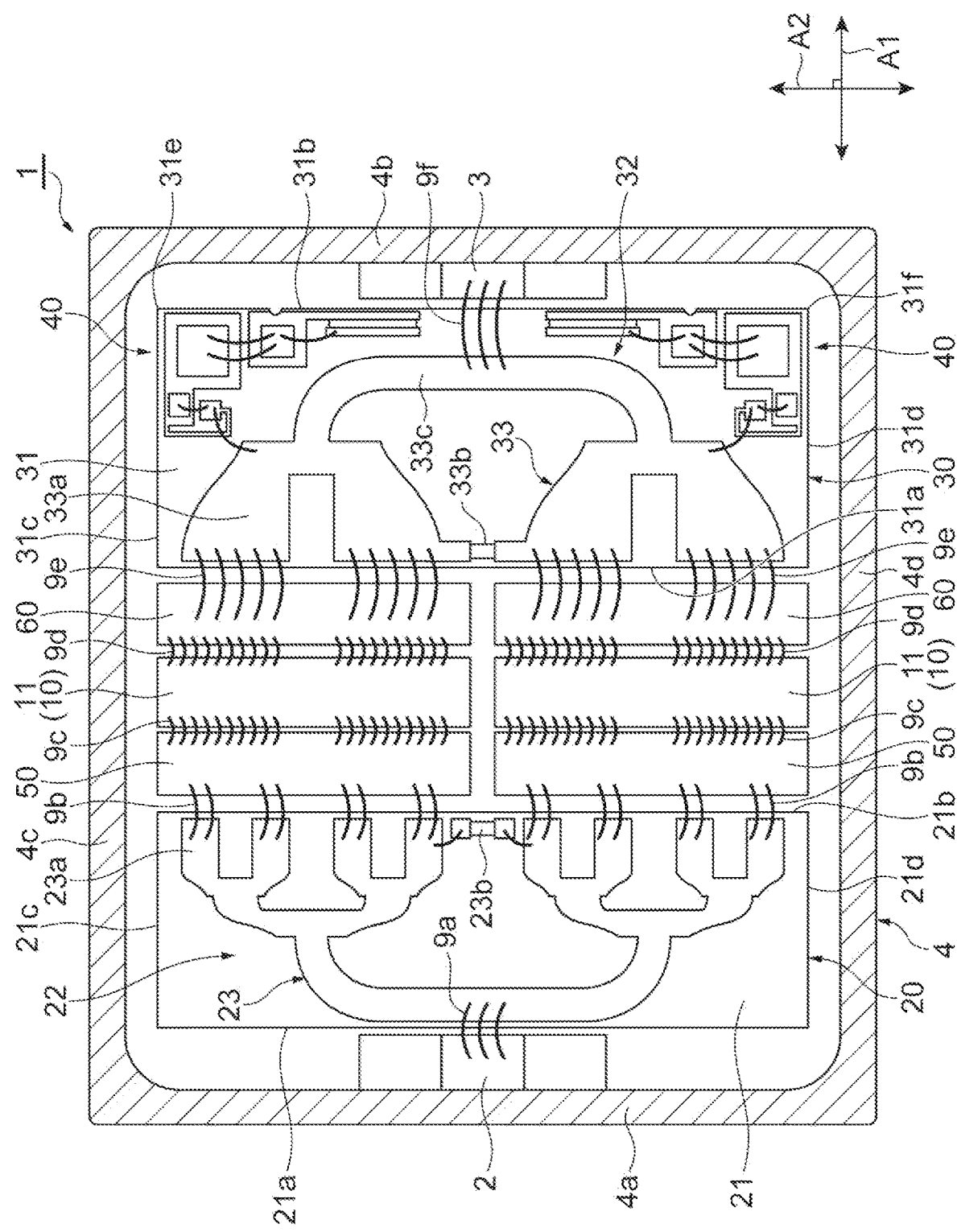
FIG. 1 is a plan view illustrating an internal configuration of a high frequency amplifier 1 according to an embodiment.

Specific examples of the high frequency amplifier according to an embodiment of the present invention will be described below with reference to the drawings. Incidentally, the present invention is not limited to these examples, but is shown by the claims, and is intended to include all modifications within a meaning and a scope equivalent to the claims. In the following description, the same reference numerals are given to the same elements in the description of the drawings, and the redundant description will be omitted.

FIG. 1 is a plan view illustrating an internal configuration of a high frequency amplifier 1 according to an embodiment of the present invention. As illustrated in FIG. 1, the high frequency amplifier 1 includes one input terminal 2, one output terminal 3, an amplification element unit 10, a branch circuit board 20, a coupling circuit board 30, a filter circuit 40, a matching circuit 50, and a matching circuit 60. The high frequency amplifier 1 according to the present embodiment includes, for example, two filter circuits 40, two matching circuits 50 and two matching circuits 60. Further, the amplification element unit includes two amplification elements 11. An output per amplification element 11 is, for example, 30 W, and an output of the entire amplification element unit 10 is, for example, 60 W. Further, the high frequency amplifier 1 includes a package 4 housing the amplification element unit 10, the branch circuit board 20, the coupling circuit board 30, the filter circuit 40, and the matching circuits 50 and 60.

The package 4 is made of metal and connected to a reference potential. A planar shape of the package 4 is substantially rectangular, and includes opposing end walls 4a and 4b in a direction A1 (a first direction) and opposing side walls 4c and 4d in a direction A2 (a second direction). The direction A1 and the direction A2 intersect each other, for example, orthogonal to each other. In addition, the package 4 includes a rectangular flat bottom plate 4e. The bottom plate 4e extends along a plane defined by the directions A1 and A2. End walls 4a and 4b stand along a pair of sides (sides extending along the direction A2) of the bottom plate 4e, and side walls 4c and 4d stand along another pair of sides (sides extending along the direction A1) of the bottom plate 4e. Incidentally, the package 4 further includes a lid not illustrated. The lid seals an upper opening formed by the end walls 4a and 4b and the side walls 4c and 4d.

The input terminal 2 is a metal wiring pattern, and a high frequency signal from an outside of the high frequency amplifier 1 is inputted to the input terminal 2. The high frequency signal is a signal based on a multicarrier transmission scheme, and is formed by superimposing a plurality of signals having different carrier signal frequencies from each other. A frequency band of the carrier signal is, for example, 500 MHz or less. The input terminal 2 is provided in a middle of the end wall 4a in the direction A2, and extends from an outside to an inside of the package 4.

The amplification element unit 10 is disposed on the bottom plate 4e of the package 4 and in a substantially middle of the package 4 in the direction A1. Each amplification element 11 of the amplification element units 10 incorporates a transistor. The transistor is, for example, a field effect transistor (FET), and in one embodiment a high electron mobility transistor (HEMT). Each amplification element 11 includes a plurality of gate fingers, a plurality of source fingers, and a plurality of drain fingers. In the direction A1, the source fingers and the drain fingers are alternately arranged, and a gate finger is arranged between each source finger and each drain finger. Gate pads (signal input ends) and source pads are alternately arranged at an end on the side of the input terminal 2 of each amplifying element 11, and drain pads (signal output ends) at an end on the side of the output terminal 3 of each amplifying element 11 are arranged. Each source pad is electrically connected to the bottom plate 4e of the package 4 through a via-hole penetrating the amplification element 11 in a thickness direction, and is set to a reference potential. Each amplification element 11 amplifies the high frequency signal input to each gate pad, and outputs the amplified high frequency signal from each drain pad.

The branch circuit board 20 is disposed on the bottom plate 4e of the package 4. The branch circuit board 20 is disposed side by side with the input terminal 2 and the amplification element unit 10 along the direction A1, and is located between the input terminal 2 and the amplification element unit 10. The branch circuit board 20 includes a substrate 21 made of ceramic and a branch circuit 22 provided on a main surface of the substrate 21. A planar shape of the substrate 21 is, for example, a rectangle in which one long side 21a faces the input terminal 2 and the other long side 21b faces the amplification element unit 10 via the matching circuit 50. A rear surface of the substrate 21 faces the bottom plate 4e of the package 4. One short side 21c of the substrate 21 is located next to the side wall 4c of the package 4, and the other short side 21d of the substrate 21 is located next to the side wall 4d of the package 4. That is, the substrate 21 extends from the vicinity of one end of the package 4 to the vicinity of the other end in the direction A2.

The branch circuit 22 includes a wiring pattern 23 provided on the main surface of the substrate 21. The wiring pattern 23 is electrically connected to the input terminal 2 via bonding wires 9a. The high frequency signal is input to the wiring pattern 23 from the middle of the substrate 21 in the direction A2. The wiring pattern 23 has a shape that is line-symmetrical with respect to a central line of the substrate 21 along the direction A1. The wiring pattern 23 repeats bifurcation from a connection point with the bonding wires 9a as a starting point, and finally reaches eight metal pads 23a. The eight metal pads 23a are arranged side by side along the long side 21b. The metal pads 23a adjacent to each other are connected to each other via a film resistor, and constitute a Wilkinson coupler. Thus, while ensuring an isolation between the plurality of gate pads of the amplification element unit 10, matching of an input impedance of the amplification element unit 10 as viewed from the input terminal 2 is achieved. Incidentally, in the drawing, only one film resistor 23b is illustrated as a representative. The eight metal pads 23a are electrically connected to the matching circuit 50 via the bonding wires 9b.

The matching circuit 50 is disposed on the bottom plate 4e of the package 4 and is disposed between the branch circuit board 20 and the amplification element unit 10 in the direction A1. The matching circuit 50 is, for example, a die capacitor, and includes a plurality of metal pads (not illustrated) on a main surface of a dielectric substrate. The number of metal pads is, for example, the same as the number of metal pads 23a. The plurality of metal pads are arranged in a line along the direction A2. Each metal pad is electrically connected to the corresponding metal pad 23a via the bonding wires 9b, and is electrically connected to the corresponding gate pad of the amplification element unit 10 through bonding wires 9c.

In matching circuit 50, a T-type filter circuit is formed by inductance components by the bonding wires 9b and 9c and a capacitance of a metal pad connected between a node between the inductance components and a reference potential (the bottom plate 4e).

The matching circuit 50 performs an impedance conversion by the T-type filter circuit. Generally, in the amplification element unit 10, the impedance obtained when the inside of the transistor is viewed from the gate pad is different from a characteristic impedance (for example, 50Ω) of a transmission line. The matching circuit 50 converts the impedance into 50Ω obtained when the inside of the package 4 is viewed from the input terminal 2 by the T-type filter circuit.

The matching circuit 60 is disposed on the bottom plate 4e of the package 4 and disposed between the amplification element unit 10 and the coupling circuit board 30 in the direction A1. Similar to the matching circuit 50, the matching circuit 60 is, for example, a parallel plate capacitor (die capacitor), and includes a plurality of metal pads (not illustrated) on a main surface of the dielectric substrate. The number of metal pads is, for example, the same as the number of metal pads 23a. The plurality of metal pads are arranged in a line along the direction A2. Each metal pad is electrically connected to the corresponding drain pad of amplification element unit 10 through the bonding wires 9d, and electrically connected to the corresponding metal pad 33a (described below) of coupling circuit board 30 via bonding wires 9e.

Also in the matching circuit 60, a T-type filter circuit is formed by inductance components by the bonding wires 9d and 9e and the capacitance of the metal pad connected between a node between the inductance components and the reference potential (bottom plate 4e). The matching circuit 60 performs an impedance conversion by this T-type filter circuit. In general, an impedance of the amplification element unit 10 obtained when the inside of the transistor is viewed from the drain pad is different from the characteristic impedance (for example, 50Ω) of the transmission line and generally has a value smaller than 50Ω. The matching circuit 60 converts the impedance into 50Ω obtained when the inside of the package 4 is viewed from the output terminal 3 by the T-type filter circuit.

The coupling circuit board 30 is disposed on the bottom plate 4e of the package 4. The coupling circuit board 30 is disposed side by side with the amplification element unit 10 and the output terminal 3 along the direction A1, and is located between the amplification element unit 10 and the output terminal 3. The coupling circuit board 30 includes a ceramic substrate 31 and a coupling circuit 32 provided on the main surface of the substrate 31. A planar shape of the substrate 31 is, for example, a rectangle, and one long side 31a faces the amplification element unit 10 via the matching circuit 60, and the other long side 31b faces the output terminal 3. A rear surface of the substrate 31 faces the bottom plate 4e of the package 4. One short side 31c of the substrate 31 is located next to the side wall 4c of the package 4, and the other short side 31d of the substrate 31 is located next to the side wall 4d of the package 4. That is, the substrate 31 extends from the vicinity of one end of the package 4 to the vicinity of the other end of the package 4 in the direction A2.

The coupling circuit 32 couples signals output from a plurality of drain pads of the amplification element unit 10 into one output signal. The coupling circuit 32 includes a wiring pattern 33 provided on the main surface of the substrate 31. The wiring pattern 33 has a shape that is line-symmetrical with respect to a central line of the substrate 31 along the direction A1. The wiring pattern 33 includes four metal pads 33a. The four metal pads 33a are arranged side by side along the long side 31a. The metal pads 33a adjacent to each other are connected to each other via a film resistor, and constitute a Wilkinson coupler. Thus, while ensuring isolation between the plurality of drain pads of the amplification element unit 10, matching of the output impedance of the amplification element unit 10 as viewed from the output terminal 3 is achieved. Incidentally, in the drawing, only one film resistor 33b is illustrated as a representative. Each metal pad 33a is electrically connected to the corresponding two metal pads of the matching circuit 60 via the bonding wires 9e. The wiring pattern 33 finally reaches a connection point with bonding wires 9f while repeatedly bonding from the four metal pads 33a. The wiring pattern 33 is electrically connected to the output terminal 3 via the bonding wires 9f. The amplified high frequency signal is output to the output terminal 3 from the middle of the substrate 31 in the direction A2.

The output terminal 3 is a metal wiring pattern, and outputs the amplified high frequency signal to the outside of the high frequency amplifier 1. The output terminal 3 is provided in the middle of the end wall 4b in the direction A2, and extends from the inside to the outside of the package 4.

The filter circuit 40 is disposed on the main surface of the substrate 31 and is electrically connected to the coupling circuit 32. The filter circuit 40 is provided to reduce third-order intermodulation distortion included in the output signal. One filter circuit 40 is disposed in a region between the middle of the substrate 31 in the direction A2 and one corner portion 31e of two corner portions 31e and 31f located on the side of the substrate 31 opposite to the amplification element unit 10. Further, the other filter circuit 40 is disposed in a region between the middle of the substrate 31 in the direction A2 and the other corner portion 31f of two corner portions 31e and 31f located on the side of the substrate 31 opposite to the amplification element unit 10. That is, the one filter circuit 40 is disposed in a region next to the corner portion 31e with respect to the center of the main surface of the substrate 31, and is disposed next to the side 31c and the side 31b of the substrate 31. The other filter circuit 40 is disposed in a region next to the corner portion 31f with respect to the center of the main surface of the substrate 31, and is disposed next to the side 31d and the side 31b of the substrate 31.

Figure 2:
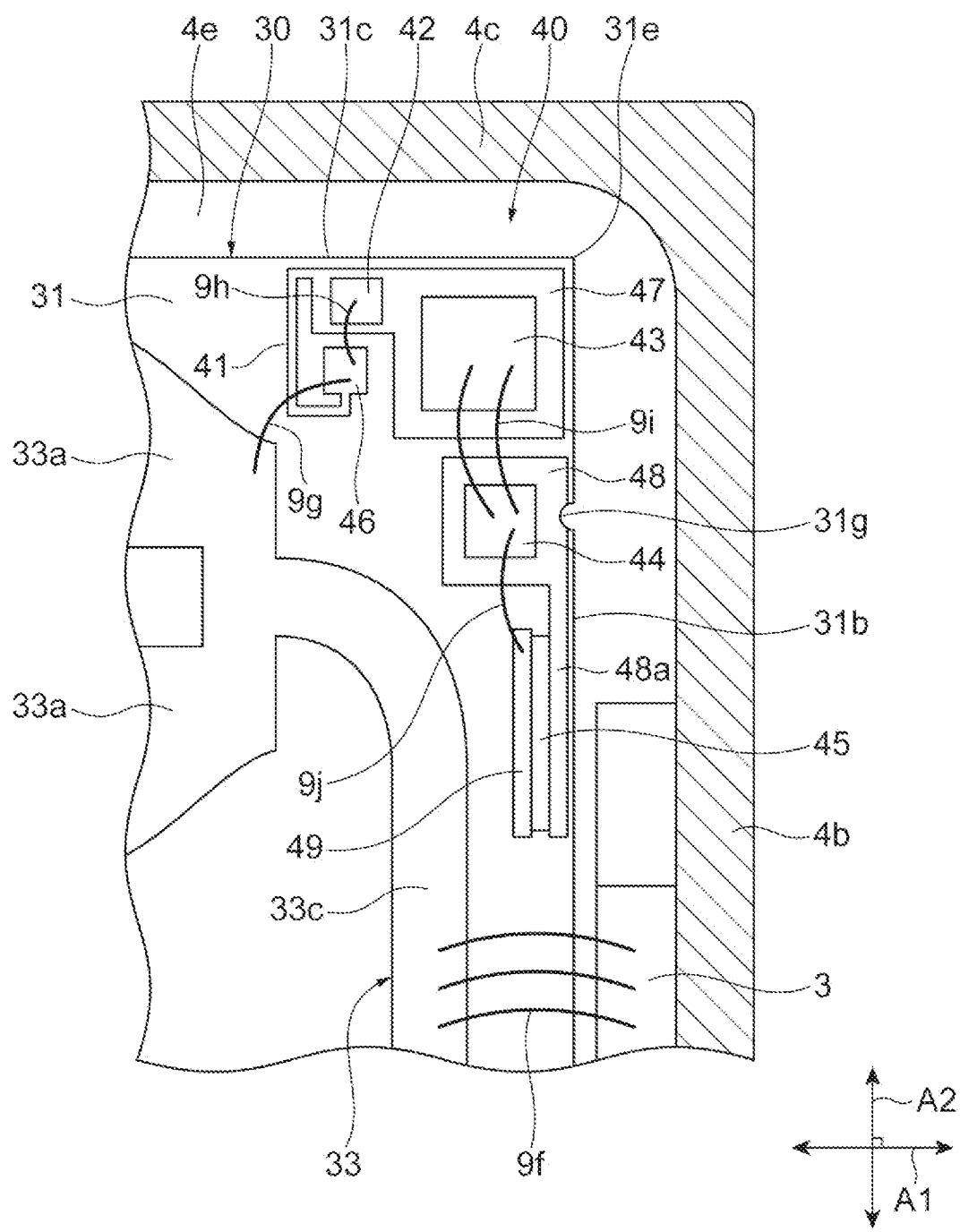
FIG. 2 is an enlarged plan view of one filter circuit 40.

FIG. 2 is an enlarged plan view of the one filter circuit 40. Incidentally, the other filter circuit 40 has the same components and connection relationship as the one filter circuit 40, and has a component arrangement that has a line-symmetrical relationship with the one filter circuit 40 with respect to a central axis line of the substrate 31 along the direction A1. The one filter circuit 40 is efficiently arranged in the vicinity of the corner portion 31e of the substrate 31 using an empty space where the wiring pattern 33 is not provided.

The filter circuit 40 includes a wiring pattern 41 as an inductor, capacitors 42 to 44, and a thin-film resistor 45. The wiring pattern 41 is a metal film formed on the main surface of the substrate 31, and has an elongated shape whose width and length are determined so as to realize a desired inductance. The wiring pattern 41 among the components of the filter circuit 40 is disposed closest to the metal pad 33a. One end of the wiring pattern 41 is connected to a relay pad 46, and the other end is connected to the wiring pattern 47. The relay pad 46 and the wiring pattern 47 are metal films formed on the main surface of the substrate 31. The relay pad 46 is electrically connected to a coupling portion of the two metal pads 33a in the wiring pattern 33 via a bonding wire 9g. The relay pad 46 is disposed between the wiring pattern 41 and the wiring pattern 47.

The wiring pattern 47 among the components of the filter circuit 40 is disposed closest to the corner portion 31e. The wiring pattern 47 has a planar shape such as a substantially L shape along the sides 31b and 31c of the substrate 31, and is connected to the other end of the wiring pattern 41 at one end on the side 31a (see FIG. 1). Thus, a relay pad 46 is disposed in an abdominal portion of the L shape, thereby saving a space of the entire filter circuit 40.

The capacitors 42 and 43 are, for example, chip-like capacitors having electrodes on front and rear surfaces, and are mounted on the wiring pattern 47. Rear surface electrodes of the capacitors 42 and 43 are electrically connected to the wiring pattern 47 via solder. A front surface electrode of the capacitor 42 is electrically connected to the relay pad 46 via a bonding wire 9h. Incidentally, a capacitance of the capacitor 43 is larger than a capacitance of the capacitor 42. Therefore, an electrode area of the capacitor 43 is larger than an electrode area of the capacitor 42. In one example, the capacitor 42 is disposed side by side with the relay pad 46 in the direction A2, and is located between the relay pad 46 and the side 31c. Further, the capacitor 43 is disposed side by side with relay pad 46 and the capacitor 42 in the direction A1, and is located between the relay pad 46 and the capacitor 42 and the side 31b.

A capacitor 44 is mounted on a reference potential pattern 48. The reference potential pattern 48 is a metal film formed on the main surface of the substrate 31. The reference potential pattern 48 is isolated from the wiring pattern 47, and is arranged side by side with the wiring pattern 47 along the side 31b. The wiring pattern 47 is located between the reference potential pattern 48 and the side 31c. In addition, the reference potential pattern 48 has a portion 48a extending in an elongated manner along the side 31b. The capacitor 44 is, for example, a parallel plate capacitor having electrodes on the front and rear surfaces. The rear surface electrode of the capacitor 44 is electrically connected to the reference potential pattern 48 via solder. The front surface electrode of the capacitor 44 is electrically connected to the front surface electrode of the capacitor 43 via bonding wires 9i, and is also electrically connected to a wiring pattern 49 via a bonding wire 9j. Incidentally, a capacitance of the capacitor 44 is larger than the capacitance of the capacitor 42 and smaller than the capacitance of the capacitor 43. Therefore, the electrode area of the capacitor 44 is larger than the electrode area of the capacitor 42 and smaller than the electrode area of the capacitor 43.

The wiring pattern 49 is a metal film formed on the main surface of the substrate 31, and extends along the direction A2 in parallel with a portion 48a of the reference potential pattern 48. The thin-film resistor 45 is formed between the portion 48a of the reference potential pattern 48 and the wiring pattern 49 on the main surface of the substrate 31 and connects the portion 48a of the reference potential pattern 48 and the wiring pattern 49. The thin-film resistor 45 has a rectangular shape whose longitudinal direction is the direction A2, and is connected to the portion 48a of the reference potential pattern 48 on one long side thereof and to the wiring pattern 49 on the other long side thereof. Therefore, the portion 48a of the reference potential pattern 48 and the wiring pattern 49 correspond to one and the other electrodes of the thin-film resistor 45, respectively. The portion 48a, the thin-film resistor 45, and the wiring pattern 49 have a rectangular shape whose longitudinal direction is the direction A2 as a whole, and is disposed between a portion of the wiring pattern 33 closest to the side 31b (a final coupling unit 33c extending along the direction A2) and the side 31b.

Figure 3:
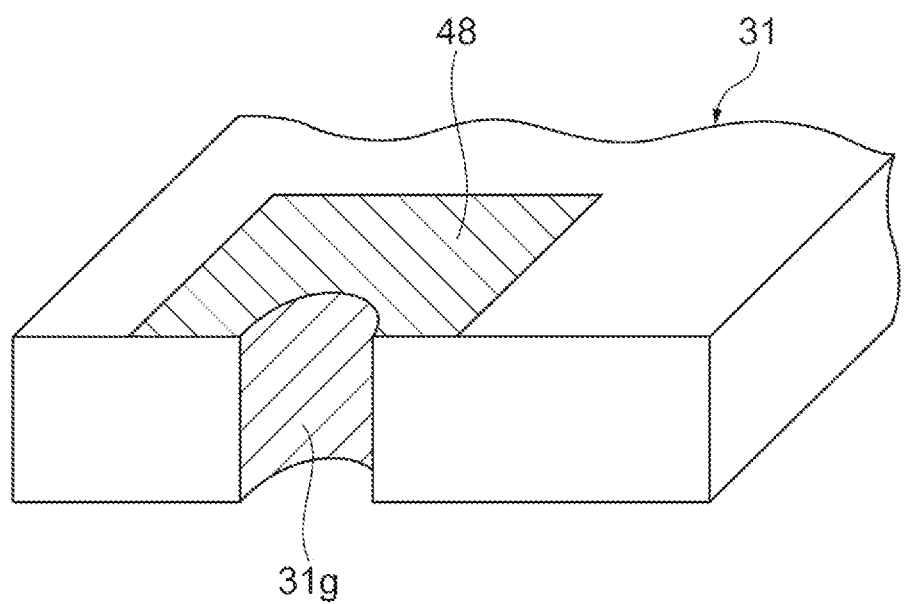
FIG. 3 is an enlarged perspective view illustrating a groove 31g.

The substrate 31 has a groove 31g on a side surface that constitutes the side 31b. FIG. 3 is an enlarged perspective view illustrating the groove 31g. As illustrated in FIG. 3, the groove 31g extends in a thickness direction of the substrate 31 and reaches from the main surface to the rear surface of the substrate 31. A cross-sectional shape of the groove 31g in a cross section perpendicular to an extending direction of the substrate 31 is, for example, an arc shape (semicircular in the present embodiment). When the cross section of the groove 31g is arc-shaped, a diameter of the cross section is, for example, 0.3 mm A metal pattern extending from the main surface to the rear surface of the substrate 31 is formed inside the groove 31g (indicated by hatching in the drawing). The reference potential pattern 48 on the main surface is electrically connected to the bottom plate 4e (see FIGS. 1 and 2) of the package 4 via the metal pattern. That is, when the substrate 31 is soldered to the bottom plate 4e, a solder fillet (soaring of solder) is formed along the groove 31g, and a good contact can be obtained between the bottom plate 4e and the metal pattern. Therefore, stability of the potential of the reference potential pattern 48 can be enhanced.

Figure 4:
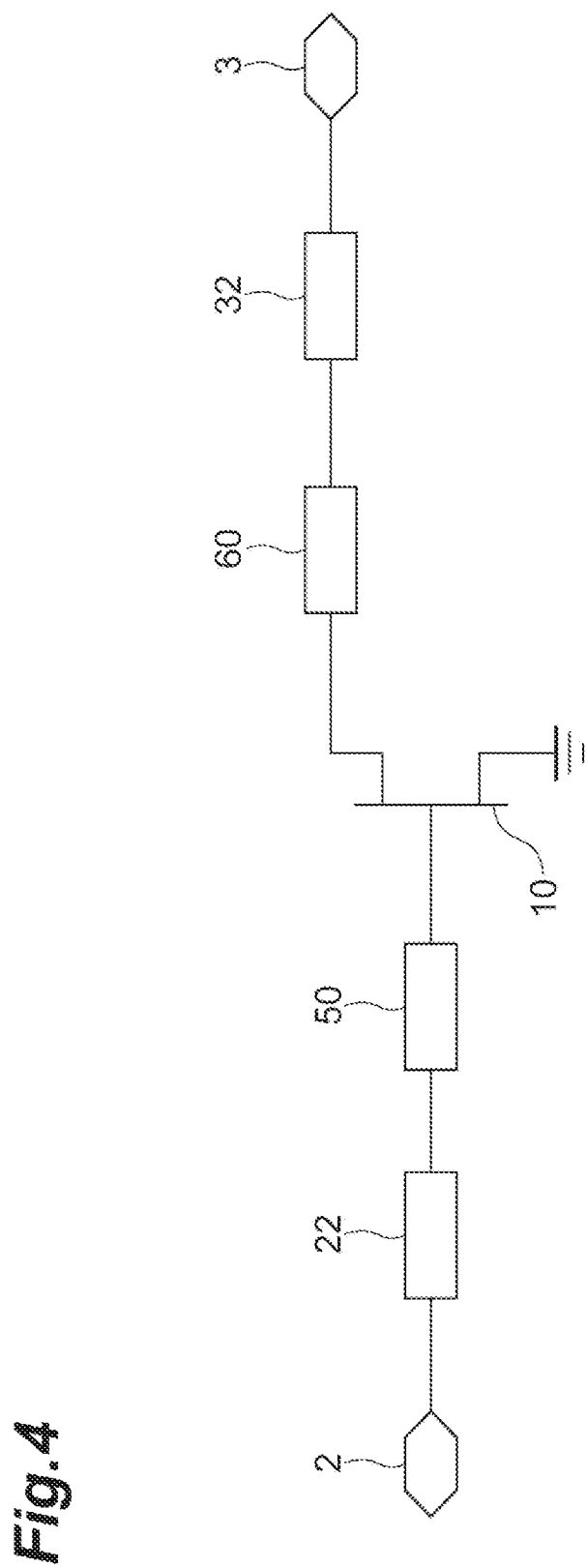
FIG. 4 is a diagram illustrating a circuit configuration of a high frequency amplifier which does not include the filter circuit 40.

Here, a circuit configuration of the high frequency amplifier 1 and the reason that the circuit configuration is preferable will be described together with problems of a high frequency amplifier in the related art. FIG. 4 is a diagram illustrating a circuit configuration of the high frequency amplifier when the filter circuit 40 is not provided. An impedance matching circuit (a branch circuit 22 and a matching circuit 50) is connected between an input side (a gate terminal) of the amplification element unit 10 and an input terminal 2, and an impedance matching circuit (a matching circuit 60 and a coupling circuit 32) is connected between an output side (a drain terminal) and an output terminal 3. In this case, when two signals (f1 and f2) having the same amplitude and different frequencies are input from the input terminal 2, a low-frequency signal (f2-f1) and a third-order intermodulation distortion signals (2f2-f1 and 2f1-f2) other than fundamental waves f1 and f2 due to non-linearity of the amplification element unit 10 appear at the output terminal 3.

Figure 5:
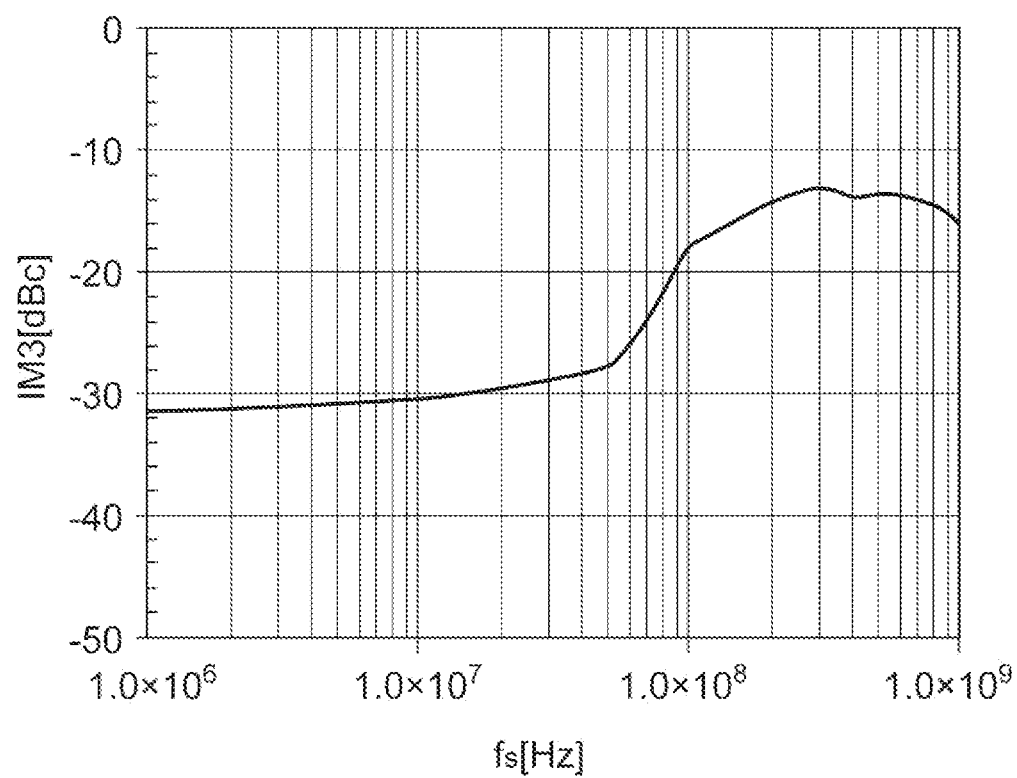
FIG. 5 is a graph showing IM3 characteristics of the high frequency amplifier illustrated in FIG. 4.

In general, the unit dBc is used for the third-order intermodulation distortion (IM3), and the IM3 is expressed as a difference (or a ratio) between an amplitude of a fundamental wave signal and an amplitude of the third-order intermodulation distortion signal when an output power of the amplification element unit 10 is fixed to a certain value. FIG. 5 is a graph showing the IM3 characteristic measured when two signals (f1=14 GHz, f2=14 GHz+fs) having the same amplitude and different frequencies are input from the input terminal 2 to the amplification element unit 10, and a power of the output signal output from the output terminal 3 is set to P3 dB (the 3-dB power compression points). The vertical axis represents a magnitude of the IM3 (unit: dBc), and the horizontal axis represents a frequency difference fs (unit: Hz). As shown in FIG. 5, in a case where the filter circuit 40 is not provided, the IM3 rapidly increases when the frequency difference fs exceeds 50 to 60 MHz.

Figure 6:
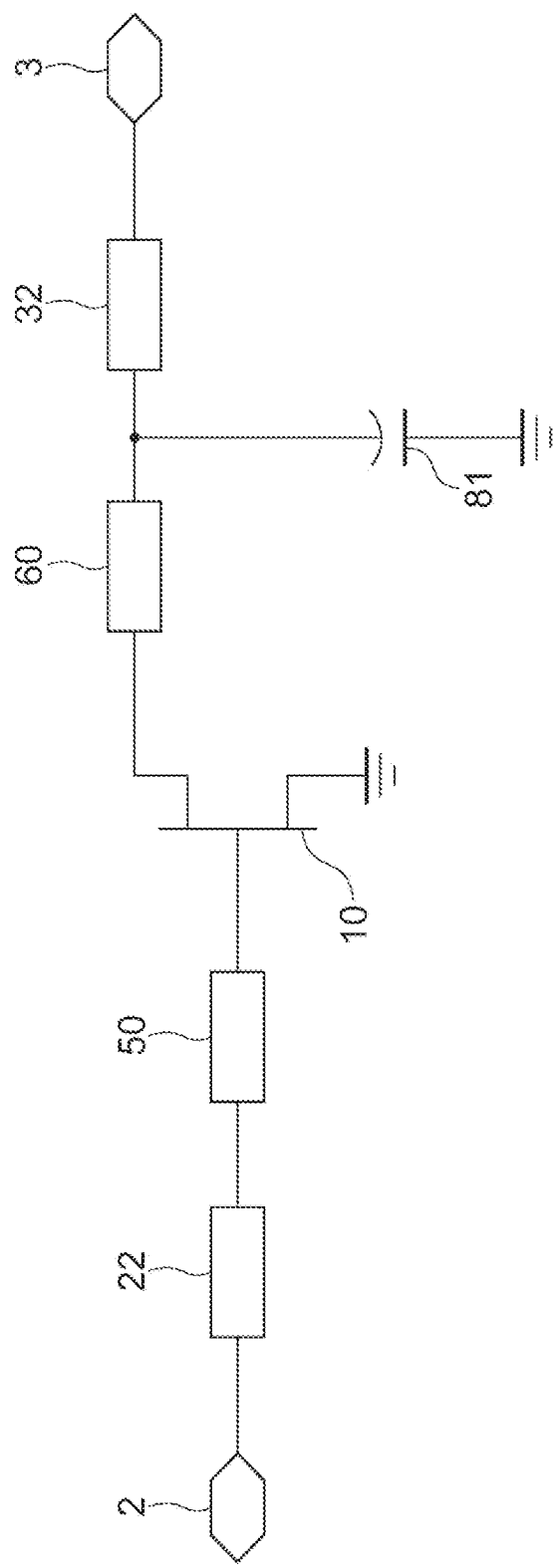
FIG. 6 is a diagram illustrating a circuit configuration of a high frequency amplifier including a capacitor 81.
Figure 7:
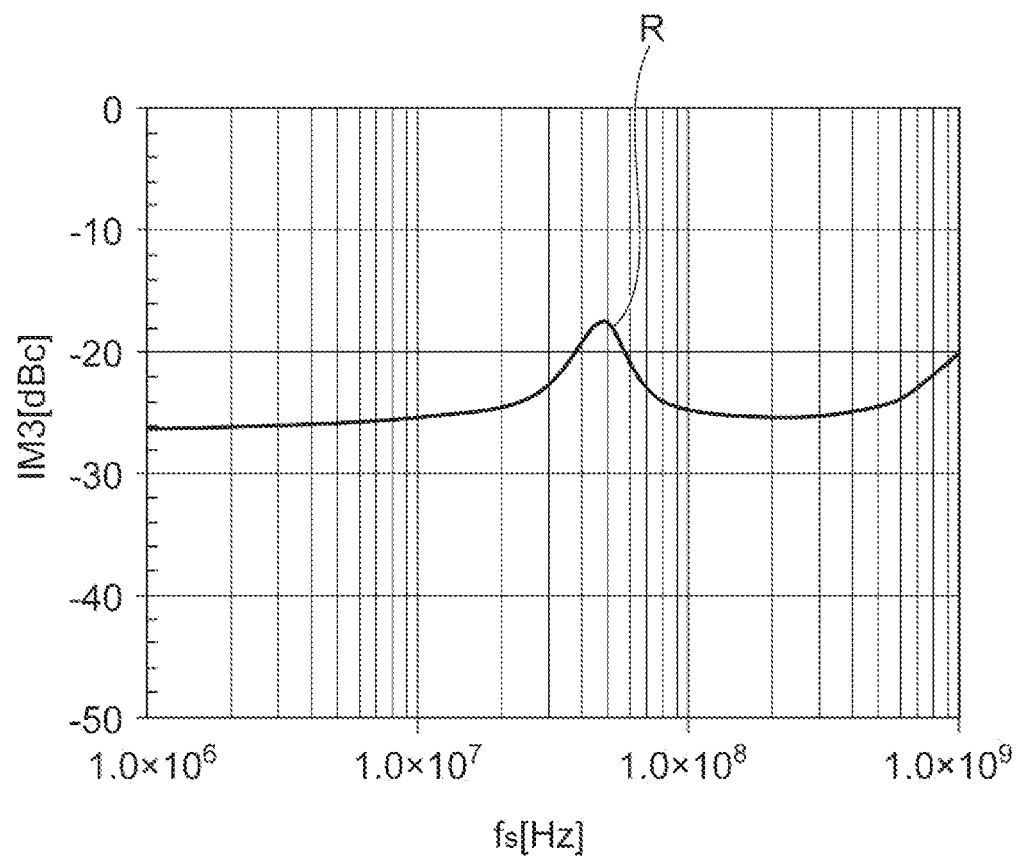
FIG. 7 is a graph showing IM3 characteristics of the high frequency amplifier illustrated in FIG. 6.

On the other hand, as illustrated in FIG. 6, the IM3 characteristic can be improved by connecting a capacitor 81 of about several hundreds of pF between the impedance matching circuit on the output side and the reference potential line. That is, by providing the capacitor 81, it is possible to lower the impedance of a low-frequency signal (f2-f1) as the output terminal 3 is viewed from the drain terminal of the amplification element unit 10, which causes generation of the IM3. So, it is possible to lower the IM3. FIG. 7 is a graph showing the IM3 characteristic measured under the same conditions as FIG. 5 in the high frequency amplifier illustrated in FIG. 6. As shown in FIG. 7, when the capacitor 81 is provided, the IM3 on the high frequency side (up to several hundreds of MHz) is reduced as compared with FIG. 5. However, a ripple R occurs around several tens of MHz, which hinders realization of the low IM3 characteristics in a wide band. Further, an impedance of the fundamental wave as the output terminal 3 is viewed from the output side of the amplification element unit 10 is affected by the capacitor 81. Thus, the IM3 is generally increased as compared with FIG. 5.

Figure 8:
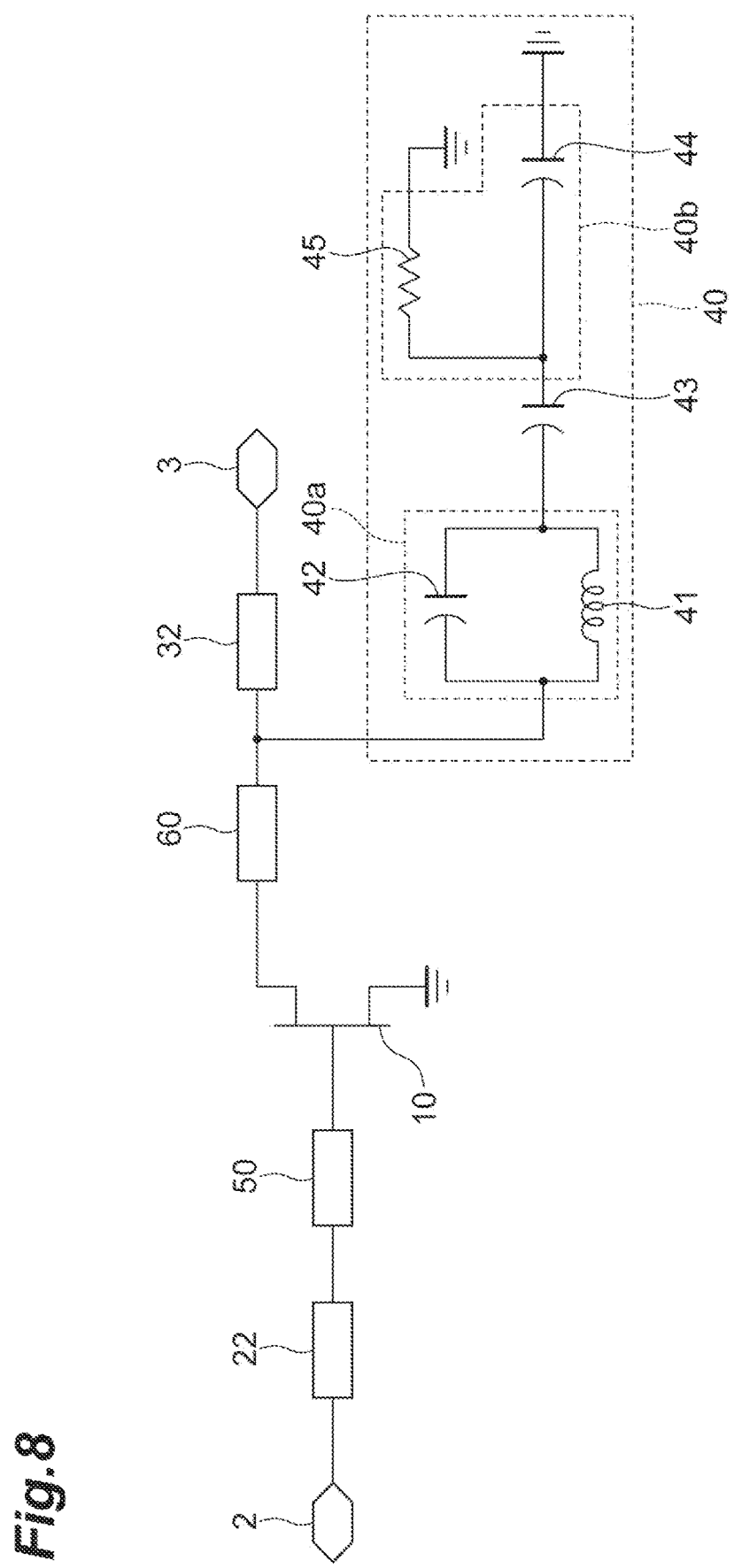
FIG. 8 is a diagram illustrating a circuit configuration of the high frequency amplifier 1.

FIG. 8 is a diagram illustrating a circuit configuration of the high frequency amplifier 1 of the present embodiment. A filter circuit 40 is connected between the impedance matching circuit on the output side and the reference potential line. As described above, the filter circuit 40 includes the wiring pattern (inductor) 41, the capacitors 42 to 44, and the thin-film resistor 45. The inductor 41 and the capacitor 42 are connected in parallel to each other to constitute an LC parallel-resonant circuit 40a. The capacitor 44 and the thin-film resistor 45 are connected in parallel to each other to constitute a CR filter circuit 40b. The LC parallel-resonant circuit 40a and the CR filter circuit 40b are connected in series to each other via the capacitor 43. The LC parallel-resonant circuit 40a is provided to reduce signal leakage of the fundamental wave. The capacitor 43 and the CR filter circuit 40b are provided to suppress a ripple R shown in FIG. 7. The thin-film resistor 45 has a damping function to reduce the ripple. The capacitor 43 also has a function of blocking a flow of direct current supplied to a drain terminal side of the amplification element unit 10 into the filter circuit 40. The LC parallel-resonant circuit 40a and the capacitor 43 are connected in series between the impedance matching circuit on the output side and the reference potential line, thereby lowering an impedance of a desired frequency.

The capacitance of the capacitor 43 is larger than the capacitances of the capacitors 42 and 44 by one or more digit. Thus, a signal of a frequency to be reduced can pass through the filter circuit 40, and an action of the filter circuit 40 can be obtained. The capacitors 43 and 44 may be configured by a plurality of capacitors connected in series or in parallel with one another.

Figure 9:
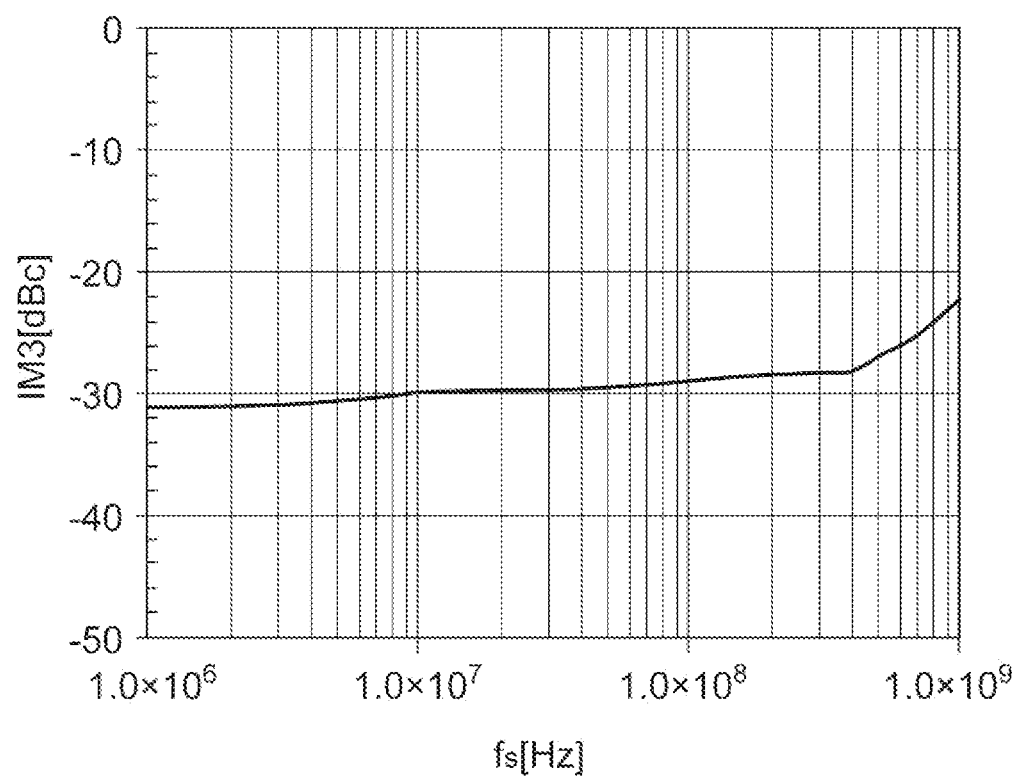
FIG. 9 is a graph showing IM3 characteristics of the high frequency amplifier 1 illustrated in FIG. 8.

FIG. 9 is a graph showing the IM3 characteristic measured under the same conditions as FIG. 5 in the high frequency amplifier 1 illustrated in FIG. 8. As shown in FIG. 9, the ripple R shown in FIG. 7 is reduced by actions of the capacitor 43 and the CR filter circuit 40b. Further, by an action of the LC parallel-resonant circuit 40a, the IM3 is totally reduced as compared with FIG. 7, and the IM3 characteristics are improved over a wide band.

As an example, a numerical value of each of components which constitute the filter circuit 40 is illustrated. The following numerical values are values when the frequency of the fundamental wave signal input to the high frequency amplifier 1 is 14 GHz.
Capacitor 42: 0.1 pF
Inductor 41: 1.3 nH
Resonant frequency fc of the LC parallel-resonant circuit 40a: 14 GHz
Capacitor 43: 5 to 20 nF
Capacitor 44: 500 to 2000 pF
Thin-film resistor 45: 0.1 to 5Ω

The effects obtained by the high frequency amplifier 1 of the present embodiment described above will be described. The high frequency amplifier 1 includes the filter circuit 40 for reducing the IM3, but as the filter circuit 40 is arranged farther from the amplification element unit 10, an effect of reducing the IM3 becomes less. In order to enhance the effect of reducing the IM3, it is desirable to dispose the filter circuit 40 next to the amplification element unit 10, but each component is mounted at a high density inside the package 4 from the viewpoint of high frequency characteristics, a mass production stability, and a reduction in manufacturing cost.

In view of these problems, in the present embodiment, each filter circuit 40 is disposed in the region between the middle of the substrate 31 of the coupling circuit board 30 and the corner portions 31e and 31f located on the side of the substrate 31 opposite to the amplification element unit 10. In the coupling circuit board 30, the coupling circuit 32 is provided on the substrate 31, but a width in the direction A2 of the entire wiring pattern 33 of the coupling circuit 32 becomes narrower each time the amplified high frequency signals output from the plurality of drain pads of the amplification element unit 10 are coupled. Therefore, slight empty spaces are generated next to the corner portions 31e and 31f of the substrate 31. By disposing the filter circuits 40 in the empty spaces respectively, each filter circuit 40 can be disposed next to the amplification element unit 10, and the effect of reducing the IM3 can be remarkably enhanced.

Further, for example, when the filter circuit is disposed outside the package as in the related art, when the device is mounted on the wiring substrate, each component of the filter circuit must be mounted on the wiring substrate in addition to the package with built-in transistors, thus increasing the number of mounting steps. By disposing the filter circuit 40 inside the package 4 as in the present embodiment, only the package 4 needs to be mounted on the wiring substrate, and the number of mounting steps can be reduced.

Further, as in the present embodiment, the filter circuit 40 may include the LC parallel-resonant circuit 40a and the CR filter circuit 40b connected in series to each other. This can reduce the ripple R shown in FIG. 7 and improve the IM3 characteristics over a wide band.

Further, as in the present embodiment, the LC parallel-resonant circuit 40a may include the wiring pattern 41 on the substrate 31 as an inductor, and the CR filter circuit 40b may include the thin-film resistor 45. Thus, the number of components of the filter circuit 40 can be reduced, and the filter circuit 40 can be further miniaturized. Incidentally, it is desirable that a value of the resistance of the CR filter circuit 40b be small in order to set a low cutoff frequency realized by cooperation with the capacitor 44. As a method of reducing the resistance value of the thin-film resistor 45, there is a method of increasing an aspect ratio (a horizontal to vertical ratio in a plan view). It is also conceivable to thicken thin-film resistive material to lower a sheet resistance value, but in a case where the lowermost layer of the wiring pattern 33 is made of the same thin-film resistive material, thickening only the resistive material of the thin-film resistor 45 is accompanied by an increase in the number of steps. As in the present embodiment, the thin-film resistor 45 is extended along the long side 31b of the substrate 31 and disposed between a final coupling portion 33c of the wiring pattern 33 and the long side 31b, whereby the thin-film resistor 45 can be disposed efficiently in the slight empty space. Further, a dimension (an interval between the input terminal 2 and the output terminal 3) of the package 4 in the direction A1 can be suppressed from being large.

Further, as in the present embodiment, the coupling circuit 32 may include a Wilkinson coupler. This makes it possible to match the output impedance of the amplification element unit 10 as viewed from the output terminal 3 while securing isolation between the plurality of drain pads of the amplification element unit 10.

Further, as in the present embodiment, the substrate 31 has the groove 31g extending in the thickness direction on the side surface, and a metal pattern extending from the main surface to the rear surface of the substrate 31 is formed inside the groove 31g. The reference potential pattern 48 on the main surface may be electrically connected to the bottom plate 4e of the package 4 via the metal pattern. Thus, for example, an outflow of the solder on the reference potential pattern 48 can be reduced as compared with a general lateral metallization, and a mounting reliability of the capacitor 44 can be enhanced. Further, even when the substrate 31 is made of a hard material such as ceramic, for example, or the substrate 31 is formed to be thick in view of a wiring width of the wiring pattern 33, the main surface side and the rear surface side of the substrate 31 can be easily conducted as compared with a method of forming a through-via in the substrate 31.

The high frequency amplifier according to the present invention is not limited to the embodiments described above, and various other modifications are possible. For example, although the amplification element unit 10 of the above embodiments includes two amplification elements 11, the amplification element unit 10 may include a single amplification element 11, or may include three or more amplification elements 11. Even in such a case, when a plurality of drain terminals are disposed side by side along the direction A2, empty spaces are generated in the vicinity of the corner portions 31e and 31f of the substrate 31 in the coupling circuit board 30, so the filter circuit 40 can be disposed efficiently.

Further, the configuration of the filter circuit according to the present invention is not limited to the configurations illustrated in FIG. 2 and FIG. 8. Various other circuits can be employed for the filter circuit as long as the filter circuit improves the IM3 characteristics.

What is claimed is:

1. A high frequency package comprising:
   a package having an input terminal and an output terminal;
   a substrate housed in the package, and having a first side, a second side facing the input terminal, and a third side facing the output terminal, the first side extending in a first direction and connecting the second side and the third side, and the second side and the third side extending in a second direction intersecting the first direction;
   a coupling circuit provided on the substrate, and electrically connected to the input terminal and the output terminal, the coupling circuit receiving amplified signals based on a high frequency input signal input to the input terminal disposed at the second side of the substrate, and outputting a high frequency output signal to the output terminal disposed at the third side of the substrate; and
   a filter circuit provided on the substrate and electrically connected to the coupling circuit, the filter circuit configured to reduce third-order IMD (Inter Modulation Distortion) included in the high frequency output signal,
   wherein the high frequency output signal is output from the coupling circuit in a middle of the output terminal side of the third side of the substrate, and
   wherein the filter circuit is arranged on an edge of the first side of the substrate, and an edge of the third side of the substrate.

2. The high frequency package according to claim 1, wherein the filter circuit has a LC parallel-resonant circuit and a CR filter circuit, the LC parallel-resonant circuit and the CR filter circuit being connected in series with each other.

3. The high frequency package according to claim 2, wherein the LC parallel-resonant circuit has an interconnection pattern on the substrate, the interconnection pattern including an inductor, and
   wherein the CR filter circuit includes a thin-film resistor.

4. The high frequency package according to claim 1, wherein the package houses a branch circuit.

5. The high frequency package according to claim 1, wherein the coupling circuit includes a Wilkinson coupling.

6. The high frequency package according to claim 1, wherein the substrate has a side face, the side face having a groove extending in a thickness direction of the substrate,
   wherein a metal pattern is provided inside the groove, the metal pattern extending to a main surface of the substrate from a rear face of the substrate, and
   wherein a reference voltage pattern provided on the main surface is electrically connected to the package via the metal pattern.

7. The high frequency package according to claim 3, wherein the substrate has a side face, the side face having a groove extending in a thickness direction of the substrate,
   wherein a metal pattern is provided inside the groove, the metal pattern extending to a main surface of the substrate from a rear face of the substrate,
   wherein a reference voltage pattern provided on the main surface is electrically connected to the package via the metal pattern,
   wherein the CR filter circuit includes a capacitor, and
   wherein the reference voltage pattern is connected to one edge of the thin-film resistor and one edge of the capacitor.

8. The high frequency package according to claim 2, wherein the CR filter circuit includes a capacitor, and
   wherein the LC parallel-resonant circuit is connected to the CR filter circuit via another capacitor.

9. The high frequency package according to claim 1, wherein the package has an input feedthrough and an output feedthrough, the input terminal being provided on the input feedthrough, and the output terminal being provided on the output feedthrough.

* * * * *